Figure 1:
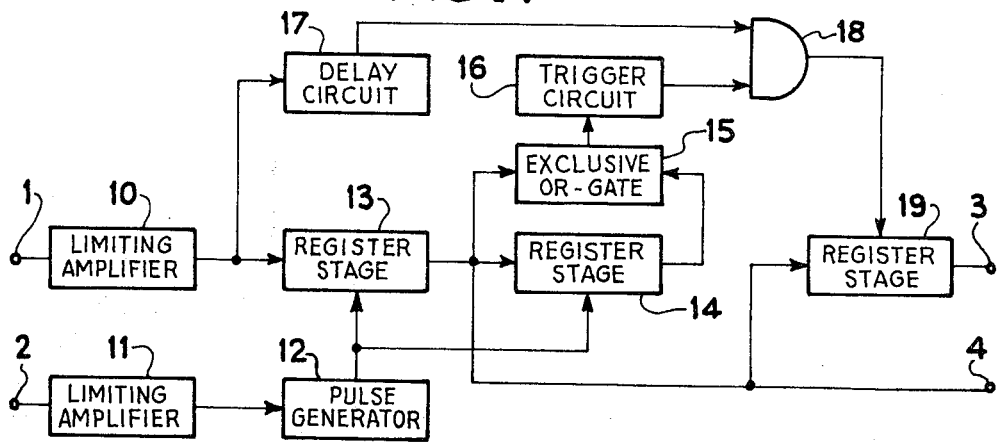

United States Patent [19]
Thiebaut

[11] 3,947,775

[45] Mar. 30, 1976

[54] PHASE AND FREQUENCY COMPARATOR

[75] Inventor: Jean-Jacques Thiebaut, Paris, France

[73] Assignee: Thomson-CSF, Paris, France

[22] Filed: Apr. 30, 1974

[21] Appl. No.: 465,548

[30] Foreign Application Priority Data
May 16, 1973 France............................ 73.17735
May 14, 1973 France............................ 73.17364

[52] U.S. Cl. ................ 328/133; 307/232; 328/134
[51] Int. Cl.² ........................................ H04B 1/02
[58] Field of Search ............ 307/232, 233; 328/133, 328/134

[56] References Cited
UNITED STATES PATENTS

| | | | |
|---|---|---|---|
| 3,441,745 | 4/1969 | Reeves et al.................... | 328/133 X |
| 3,460,034 | 8/1969 | Tanner........................... | 328/133 X |
| 3,646,455 | 2/1972 | Coccagna ......................... | 328/133 |
| 3,723,889 | 3/1973 | Oberst............................ | 328/134 |
| 3,755,746 | 8/1973 | Hogue et al. ..................... | 328/133 |

Primary Examiner—Nathan Kaufman
Attorney, Agent, or Firm—Cushman, Darby & Cushman

[57] ABSTRACT

The comparator comprises a circuit for detecting the sign of the phase-shift of the reference signal relatively to the second signal for a predetermined phase of the latter. It delivers a corresponding binary phase difference signal.

A second circuit selects those changes in values of the phase difference signal which occur for a phase of the reference signal comprised in a predetermined phase interval, and are thus surely representative of a change in the sign of the frequency difference.

3 Claims, 3 Drawing Figures

PHASE AND FREQUENCY COMPARATOR

The invention relates to a digital frequency and phase comparator intended more particularly for use as an error detecting element in control systems for phase-synchronising an auxiliary signal with a reference signal.

A digital frequency comparator has been proposed in U.S. Pat. No. 3 501 701, which comparator delivers a two-state binary signal indicating the sign of the difference of the two compared frequencies. However, this signal is not sufficient if phase control is also desired.

The object of the present invention is a simple digital frequency and phase comparator delivering both a first two-state binary signal indicative of the sign of the difference of the phases of the two compared signals and a second two-state binary signal indicative of the sign of the difference of their frequencies, this second error signal being self-sufficient for use in a frequency and phase synchronisation system, while the first error signal may be used for accelerating the phase synchronisation.

According to the invention there is provided a phase and frequency comparator having two inputs for respectively receiving a reference signal of period T and a second signal, and comprising: a comparison circuit for detecting the sign of the phase shift between said signals for a predetermined phase $\phi_o$ of each period of the second signal and delivering a two-value phase-shift signal; and a second circuit, fed by said comparison circuit, for delivering a two-value frequency difference signal indicative of the sign of the frequency difference between said reference signal and said second signal, said second circuit comprising means for detecting those particular changes in the value of said phase shift signal occurring for a phase of the reference signal included in a limited phase interval comprising one and only one value for which the amplitude of the reference signal is zero, and for changing the value of said frequency difference signal for each of said particular changes.

Figure 2:
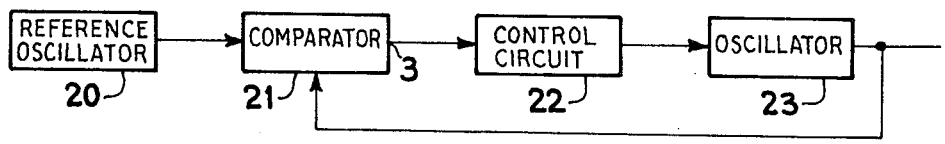
Figure 3:
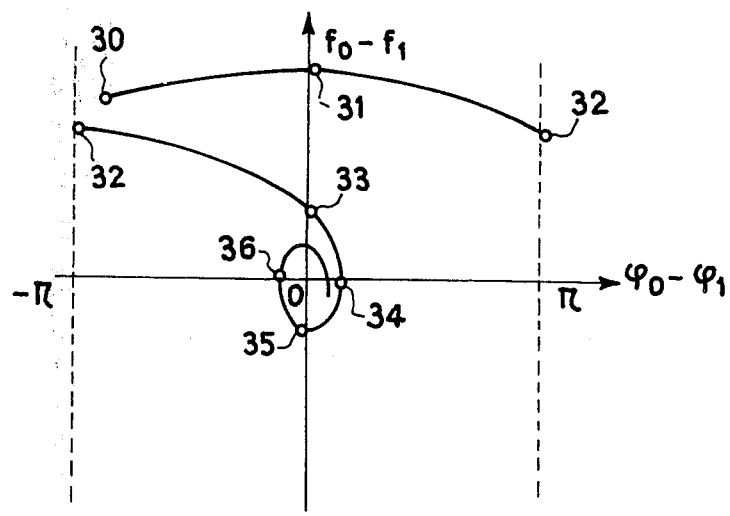

The invention will be more readily understood and other features will be apparent from the following description with reference to the accompanying drawing wherein:

FIG. 1 is a synoptic diagram of a phase and a frequency comparator according to the invention, FIG. 2 is a diagram of a control system comprising a comparator according to the invention, FIG. 3 is a diagram in explanation of the operation of the control system according to FIG. 2.

Referring to FIG. 1, the phase and frequency comparator comprises two inputs 1 and 2 intended to receive respectively a sinusoidal reference signal of frequency $f_o$ and an auxiliary signal, and an output 3 for delivering a binary signal, the two states of which respectively show that the frequency of the auxiliary signal is greater or less than that of the reference signal, and an output 4 for delivering a binary signal whose two states respectively indicate that the auxiliary signal is leading or lagging in phase in relation to the reference signal. The input 1 is connected to a limiting amplifier 10 which delivers a square wave, the states 1 and 0 of which correspond respectively to the half-cycles [$-\pi$, 0] and [0, $\pi$] of the reference signal. The input 2 is connected to a limiting amplifier 11, the output of which feeds a pulse generator circuit 12 which comprises a differentiating circuit followed by a monostable trigger circuit; it delivers pulses whose duration (equal to the duration of the quasi-stable state of the monostable trigger circuit) is short in comparison with the periods of the two signals, and the position of which is characteristic of the trailing edges of the output signal of the amplifier 11, and hence characteristic of the phase 0 (modulo $2\pi$) of the auxiliary signal received at 2 if the latter is a sinusoidal signal. These pulses are applied to the clock inputs of two shift-register stages 13 and 14 connected in cascade. The first stage 13 is connected by its signal input to the output of the amplifier 10.

These elements constitute a first part of the comparator.

On each cycle of the auxiliary signal and for the phase 0 of this signal, the first stage 13 receives a clock pulse and samples the square wave signal which it receives from amplifier 10. It records a state 1 or 0 depending on whether the reference signal is lagging or leading in phase in relation to the auxiliary signal during the cycle in question. The binary signal registered is a characteristic signal of the phase-shift of the two signals at the instant of the sampling.

The output of stage 13 forms the output 4 of the comparator and transmits the phase-shift sign in binary form.

A basic principle of the comparator is to use the phase-shift variations of the two signals to determine the sign of their frequency difference. It can, in fact, be shown that the changes in the binary phase-shift signal correspond to a negative frequency difference $(f_o - f_1)$ if they occur from state 0 to state 1 and for a (negative) phase-shift less, in absolute value, than a predetermined negative value $-E_1$, and a positive frequency difference $(f_o - f_1)$ if they occur from state 1 to state 0 and for a (positive) phase-shift less than a predetermined value $E_2$, $f_o$ and $f_1$ being the respective frequencies of the reference signal and the auxiliary signal. Calculation shows that, for a given frequency $f_o$, $E_1$ and $E_2$ respectively depend upon the minimum and maximum values of the frequency $f_1$ which are thus limited, the first having a lower threshold and the second an upper threshold since $E_1$ and $E_2$ must be positive. If a value $E = E_1 = E_2$ is chosen beforehand so that the useful changes in value of the phase-shift signal are sufficiently numerous for a desired application, a lower and an upper threshold are thereby imparted to the frequency $f_1$ so that the changes in value of the phase-shift signal thus unambiguously indicate the sign of the frequency difference if they occur for a phase-shift signal, i.e. a phase of the reference signal, comprised between $-E$ and $E$. For instance for $E = \pi/2$, as in the described comparator, these threshold values are respectively $4f_o/5$ and $4f_o/3$.

The second part of the comparator in the example illustrated comprises the second shift register stage 14, which reproduces the state of the first stage with a delay equal to one cycle of the auxiliary signal, an "exclusive OR" gate 15, also called "anticoincidence circuit", the two inputs of which receive the output signals of the first and second shift-register stages 13 and 14, and a monostable trigger circuit 16 which delivers a short-duration pulse for each leading edge of the output signal of gate 15. The third part of the comparator comprises a delay circuit 17 which delivers the square signal from the amplifier 10 with a fixed delay equal to one-quarter of the cycle of the reference signal, and by an AND gate 18, the two inputs of which receive the delayed square signal from circuit 17 and the pulses from circuit 16. The gate 18 transmits the pulses from circuit 16 only when they are produced for a reference signal phase lying between $-\pi/2$ and $+\pi/2$. The pulses transmitted are applied to the clock input of a third shift register stage 19, the output of which forms the output 3 of the comparator and the signal input of which is connected to the output of the first stage 13. The third stage registers a state 1 characteristic of a negative frequency difference $(f_o - f_1)$ or a state 0 characteristic of a positive frequency difference depending upon whether the transition resulting in the clock pulse was a transition of the type $0 - 1$ or of the type $1 - 0$.

The signal available at output 3 is characteristic of the frequency difference sign as from the time when a transition of the phase-shift signal is detected. Thereafter it takes the value 1 for a detected frequency of the auxiliary signal greater than the frequency $f_o$ and the value 0 for a detected frequency of the auxiliary signal less than the frequency $f_o$. This comparator may be considered as a phase comparator or as a frequency comparator.

On the basis of its operating principle it has a wide range of operation; it delivers the frequency difference sign without any ambiguity for values of the frequency $f_1$ lying between $4f_o/5$ and $4f_o/3$. It also enables very small frequency differences to be detected provided that the comparison is carried out over an adequate number of auxiliary signal cycles to enable a transition of the phase-shift signal to be detected. However, it does not provide the sign of the phase difference between two signals at the same frequency (e.g. those delivered by a single generator).

As regards its properties, the comparator advantageously lends itself to use as an error detector in a frequency and phase control system. FIG. 2 is the diagram of such a control system.

The circuit according to FIG. 2 comprises a reference oscillator 20 of frequency $f_o$, an oscillator 23 of frequency $f_1$, the frequency and the phase of which are to be controlled, a comparator of the above type, 21, which receives the output signals of the two oscillators, and a control circuit 22 disposed between the output 3 of the comparator 21 and the frequency control input of the oscillator 23, the output 4 of the comparator not being used in this system.

The oscillator 23 is a variable-frequency oscillator, for example of the variable-capacity diode type, the oscillation frequency of which is determined by a control voltage. The control circuit 22 is formed by a bistable trigger circuit which delivers a voltage $+ U$ or a voltage $- U$ depending upon the value of the binary signal that it receives, and by an integrator which receives the output voltage of the previous circuit and feeds the control input of the oscillator 23.

The operation of the control device will now be described with references to FIG. 3, which shows a phase plan of the successive states of the control system. The horizontal axis of this phase plan shows the phase-shift $\phi = \phi_o - \phi_1$ between the two signals, while the vertical axis shows their frequency difference $(f_o - f_1)$.

To plot the graph it was assumed that the signal of oscillator 23 at the initial time had a frequency less than the frequency $f_o$ and a phase lead of about 180°; the control system is in the state shown by point 30. It had also been assumed that the comparator 21 — which had not yet detected any transition of the phase-shift signal — delivered an erroneous indication 1 (characteristic of a negative frequency difference). The integrator of circuit 22 delivers an increasing voltage to oscillator 23, which tends to reduce the frequency $f_1$ and increase the frequency difference. At the same time there is a phase drift which tends to increase the phase-shift $\phi$ algebraically.

At the time 31 the phase-shift changes sign and the comparator 21 then delivers a correct information 0; the integrator delivers a decreasing voltage which by acting on the oscillator 23 tends to increase the frequency $f_1$; the phase drift continues in the same direction because the frequency $f_1$ is still below the frequency $f_o$.

As the time 32 the phase-shift changes sign but the comparator 21 does not detect it and continues to transmit a signal 0.

At the time 33 the phase-shift changes sign, the comparator detects it and transmits a signal 0.

At time 34 the frequency difference changes sign; this change is not detected, the voltage of the integrator continues to decrease and the frequency $f_1$ continues to increase; the phase drift changes direction.

At time 35 the comparator detects a change of sign of the phase-shift from state 0 to state 1 and delivers a signal 1; the integrator then delivers an increasing voltage and the frequency $f_1$ tends to decrease; the phase drift continues in the same direction.

At time 36 the frequency difference changes sign without being detected; the frequency $f_1$ continues to decrease but the direction of the phase drift is reversed. The system then continues to progress in the same way; the error signal and the direction of the correction change sign whenever the figurative point passes through the vertical axis, i.e. whenever the phase-shift changes sign; the phase drift changes direction whenever the figurative point passes through the horizontal axis, i.e. whenever the frequency difference changes sign.

It may be shown that the trajectory of the figurative point tends towards a limit cycle which surrounds the point 0, at which point the phase-shift and frequency difference are zero; phase error $\phi_2$ and a frequency error $f_2$ correspond to this limit cycle and may be made as low as required by adjusting the parameters of the control system.

The invention is not limited to the embodiments described in conjunction with FIGS. 1 and 2.

It will be noted that the phase difference signal appearing at the output 4 (FIG. 1) of the comparator was not used in the described control system in FIG. 2.

This signal may be used in a control system for modulating the amplitude of the correction signal derived from the frequency difference signal, according to whether a change of sign of the phase difference signal is or is not associated with a change of sign of the frequency difference signal; the first case indicates that the control system is in the neighborhood of synchronism, so that only a small correction should be applied, while the second case indicates that a larger correction is required.

In the described comparator, the changes in the binary phase-shift signal are retained when they occur in a limited phase interval comprising the value 0. It is also possible, but without further advantage, to take into account phase changes provided they occur in a limited phase interval comprising the value $\pi$, a change from the 1 to the 0 state being then indicative of a negative frequency difference $(f_o - f_1)$, and a change from the 0 to the 1 state of a positive frequency difference $(f_o - f_1)$.

Of course, the invention is not limited to the embodiments described and shown which were solely by way of example.

What is claimed is:

1. A phase and frequency comparator having first and second inputs for respectively receiving a reference signal of period T and a second signal, and comprising: a comparison circuit coupled to said first and second inputs, and comprising means for, each time said second signal has a predetermined phase $\phi_o$ for which the amplitude of said second signal is zero, determining the sign of the phase-shift, measured between $-\pi$ and $+\pi$, of said reference signal relatively to said second signal, and delivering to said output a phase-shift digital signal having one or the other of two values depending upon the sign of this phase-shift; and a second circuit coupled to said first input, and to said output of said comparison circuit, comprising comparison means and gating means for detecting those particular phase-shift digital signals which simultaneously fulfill the two following conditions (i) they differ in value from the preceding phase-shift digital signal and (ii) they occur while the phase of the reference signal is included in a limited phase interval comprising one and only one value for which the amplitude of the reference signal is zero, and delivering to said output of said second circuit a frequency difference signal, the value of which is equal to the value of the last detected one of said particular phase-shift signals.

2. A phase and frequency comparator as claimed in claim 1, wherein said comparison circuit comprises a limiting circuit for converting said reference signal into an intermediate binary signal which changes state for the phases $\phi_o$ and $\phi_o + \pi$ of said reference signal, a pulse generator supplying a pulse every time the phase of second signal is $\phi_o$ and a sampling circuit for sampling said intermediate binary signal by said pulse, the output of said sampling circuit delivering said phase-shift digital signal.

3. A phase and frequency comparator as claimed in claim 2, wherein said comparing means include a memory element for temporarily storing each phase-shift digital signal and means coupled to said sampling circuit and to said memory element for delivering a control signal upon the digital signal stored in said memory element differing from the digital signal being delivered by said sampling circuit, and said gating means include means for delaying said intermediate binary signal and means for gating said control signal by means of the delayed intermediate binary signal, said second circuit further comprising a further memory element and means for storing the signal delivered by said sampling circuit in said further memory element, upon said gating means delivering an output pulse.

* * * * *